United States Patent
Suh et al.

(10) Patent No.: US 9,287,116 B2
(45) Date of Patent: Mar. 15, 2016

(54) METHOD OF FORMING MULTILAYER GRAPHENE STRUCTURE

(71) Applicant: Samsung Electronics Co., Ltd., Suwon-Si, Gyeonggi-Do (KR)

(72) Inventors: Hwansoo Suh, Gunpo-si (KR); Insu Jeon, Incheon (KR); Young-jae Song, Suwon-si (KR); Qinke Wu, Suwon-si (KR); Seong-jun Jung, Suwon-si (KR)

(73) Assignees: Samsung Electronics Co., Ltd., Gyeonggi-do (KR); Research & Business Foundation Sungkyunkwan University, Gyeonggi-do (KR)

( * ) Notice: Subject to any disclaimer, the term of this patent is extended or adjusted under 35 U.S.C. 154(b) by 0 days.

(21) Appl. No.: 14/309,128

(22) Filed: Jun. 19, 2014

(65) Prior Publication Data
US 2015/0214048 A1    Jul. 30, 2015

(30) Foreign Application Priority Data
Jan. 28, 2014    (KR) .................... 10-2014-0010888

(51) Int. Cl.
*H01L 29/15*    (2006.01)
*H01L 21/02*    (2006.01)

(52) U.S. Cl.
CPC ...... *H01L 21/02527* (2013.01); *H01L 21/0262* (2013.01); *H01L 21/02425* (2013.01); *H01L 21/02458* (2013.01); *H01L 21/02505* (2013.01); *H01L 21/02664* (2013.01)

(58) Field of Classification Search
CPC .................... H01L 29/1606; H01L 21/02505; H01L 21/02458; H01L 21/0254; H01L 33/007
USPC ............. 257/76, 9, 29, 40, 14; 428/215, 408, 428/141; 156/230; 438/215, 408, 141
See application file for complete search history.

(56) References Cited

U.S. PATENT DOCUMENTS

| | | | |
|---|---|---|---|
| 7,927,978 B2 | 4/2011 | Pfeiffer | |
| 8,159,037 B2 | 4/2012 | Woo et al. | |
| 2009/0294759 A1* | 12/2009 | Woo ...................... | B82Y 10/00 257/29 |
| 2010/0055464 A1* | 3/2010 | Sung ........................ | B01J 21/18 428/408 |
| 2012/0015166 A1* | 1/2012 | Kelber ................... | B82Y 30/00 428/215 |
| 2012/0225296 A1 | 9/2012 | Zhong et al. | |
| 2012/0267041 A1* | 10/2012 | Woo ...................... | B32B 37/02 156/230 |

(Continued)

FOREIGN PATENT DOCUMENTS

KR    20130032536 A    4/2013

OTHER PUBLICATIONS

Zhou, H. et al "Chemical Vapour Deposition Growth of Large Single Crystals of Monolayer and Bilayer Graphene", Jun. 27, 2013, p. 1-8, Nature Communications.

(Continued)

*Primary Examiner* — Mohammed Shamsuzzaman
(74) *Attorney, Agent, or Firm* — Harness, Dickey & Pierce, P.L.C.

(57) ABSTRACT

According to example embodiments, a method of forming a multilayer graphene structure includes forming a sacrificial layer on the growth substrate, growing a first graphene layer on the sacrificial layer using a chemical vapor deposition (CVD) method, and growing at least one more graphene layer on the growth substrate. The growing at least one more graphene layer includes removing at least a part of the sacrificial layer.

16 Claims, 5 Drawing Sheets

(56) References Cited

U.S. PATENT DOCUMENTS

2013/0078424 A1* 3/2013 Ding .................. C23C 16/0254 428/141
2013/0240830 A1* 9/2013 Seacrist ............ H01L 21/02458 257/9

OTHER PUBLICATIONS

Li, X. et al, "Large-Area Graphene Crystals Grown by Low-Pressure Chemical Vapor Deposition of Methane on Copper", Nov. 1, 2010, p. 1-4, ACS Publications.

Li, Q. et al "Growth of Adlayer Graphene on Cu Studied by Carbon Isotope Labeling", Dec. 19, 2012, p. 1-5, ACS Publications.

Li, X. et al "Graphene Films With Large Domain Size by a Two-Step Chemical Vapor Deposition Process", May 7, 2010, p. 1-7, American Chemical Society.

Chen, S., et al "Millimeter-Size Single-Crystal Graphene by Suppressing Evaporative Loss of Cu During Low Pressure Chemical Vapor Deposition", Feb. 6, 2013, p. 1-4, Wiley-VCH Verlag GmbH & Co. KGaA, Weinheirn.

* cited by examiner

US 9,287,116 B2

METHOD OF FORMING MULTILAYER GRAPHENE STRUCTURE

RELATED APPLICATIONS

This application claims priority under 35 U.S.C. §119 to Korean Patent Application No. 10-2014-0010888, filed on Jan. 28, 2014, in the Korean Intellectual Property Office, the disclosure of which is incorporated herein in its entirety by reference.

BACKGROUND

1. Field

The present disclosure relates to a graphene forming method, and more particularly, to a method of forming a multilayer graphene structure including a plurality of graphene layers that are epitaxially grown.

2. Description of Related Art

Recently, research has been carried out for applying graphene to a variety of fields such as nanoelectronics, optoelectronics, and chemical sensors. Graphene is a material having a structure in which carbon atoms are two-dimensionally combined. Graphene may have a very thin thickness (e.g., atom unit level). Graphene may be generally used in the form of a sheet. Also, graphene exhibits higher electrical mobility and superior thermal characteristics, compared to silicon (Si), and may have chemical stability and a large surface. Graphene may be synthesized by a chemical vapor deposition (CVD) method or by detaching a layer of graphite.

When graphene is synthesized using a CVD method, one graphene layer may be formed on a growth substrate. Meanwhile, by controlling a growth speed, a first graphene layer may be formed on the growth substrate, and a second graphene layer may be formed as carbon atoms provided between the first graphene layer and the growth substrate. However, it may be difficult to form three or more graphene layers in a large area.

SUMMARY

Example embodiments relate a method of forming a multilayer graphene structure including a plurality of graphene layers that are epitaxially grown.

Additional aspects will be set forth in part in the description which follows and, in part, will be apparent from the description, or may be learned by practice of example embodiments.

According to example embodiments, a method of forming a multilayer graphene structure includes forming a sacrificial layer on a growth substrate, growing a first graphene layer on the sacrificial layer using a chemical vapor deposition (CVD) method, and growing at least one more graphene layer on the growth substrate. The growing at least one more graphene layer includes removing at least a part of the sacrificial layer.

In example embodiments, the growing at least one more graphene layer may include an epitaxial growth process.

In example embodiments, the growth substrate may include at least one of Cu, Ni, Pt, Rh, Ir, and Ag.

In example embodiments, the forming the sacrificial layer may include forming at least one hexagonal boron nitride (h-BN) film on the growth substrate.

In example embodiments, the forming sacrificial layer may include growing the h-BN film using a CVD process.

In example embodiments, a growth temperature of the h-BN film in the CVD process may be about 950° C. to about 1075° C.

In example embodiments, a growth time of the h-BN in the CVD process may be about 20 minutes to about 60 minutes.

In example embodiments, a thickness of the sacrificial layer may be about 1 nm to about tens of nm.

In example embodiments, the growing at least one more graphene layer may include: forming a second graphene layer on an upper surface of the h-BN film using the CVD method, removing a first part of the h-BN film under the first graphene layer during the forming the second graphene layer using the CVD method, and forming a third graphene layer by epitaxially growing the third graphene layer on the h-BN film. A lower surface of the second graphene layer may be on the third graphene layer.

In example embodiments, the CVD method may include one of a low pressure chemical vapor deposition (LPCVD) method, an atmosphere pressure chemical vapor deposition (APCVD) method, and a plasma enhanced pressure chemical vapor deposition (PECVD) method.

In example embodiments, growth temperatures for forming the second and third graphene layers may be about 900° C.~about 1050° C.

In example embodiments, the CVD method may include $CH_4$ as a process gas.

In example embodiments, the CVD method used for forming the second graphene layer may include generating hydrogen atoms by decomposing the $CH_4$, and removing the first part of the h-BN film under the first graphene layer using the hydrogen atoms generated as the $CH_4$ is decomposed.

In example embodiments, the method may further include removing a second part of the h-BN film provided during the forming the third graphene layer, and forming a fourth graphene layer by epitaxially growing the fourth graphene layer on the h-BN film. A lower surface of the third graphene layer may be on the fourth graphene layer.

In example embodiments, the growing at least one more graphene layer may include growing a number of the graphene layers according to a thickness of the sacrificial layer.

In example embodiments, the growing at least one more graphene layer may include growing a second graphene layer and a third graphene layer on the growth substrate.

According to example embodiments, a method of forming a multilayer graphene structure includes forming N sacrificial films on a growth substrate, and forming M graphene layer on the growth substrate using a chemical vapor deposition (CVD) method. The N sacrificial films are stacked on top of each other. Also, N is an integer greater than 1, and M is an integer greater than 1 and less than or equal to N. The forming M graphene layer includes removing M of the sacrificial films during the CVD method.

In example embodiments, the growth substrate may include a catalyst for forming the M graphene layers using the CVD method, and the N sacrificial films may be hexagonal boron nitride (h-BN) films.

In example embodiments, the forming the N sacrificial films may include forming N sacrificial films directly on the growth substrate, the forming M graphene layers may include forming N graphene layers, and a number of the graphene layers formed during the forming the M graphene layers may be controlled based on a quantity of the sacrificial films formed during the forming N sacrificial films.

In example embodiments, M may be greater than or equal to 3.

In example embodiments, the CVD method may include at least one of using $CH_4$ as a process gas, and a process temperature of about 900° C. to about 1050° C.

BRIEF DESCRIPTION OF THE DRAWINGS

These and/or other aspects will become apparent and more readily appreciated from the following description of non-limiting embodiments, as illustrated in the accompanying drawings in which like reference characters refer to like parts throughout the different views. The drawings are not necessarily to scale, emphasis instead being placed upon illustrating principles of example embodiments. In the drawings.

DETAILED DESCRIPTION

Figure 1:
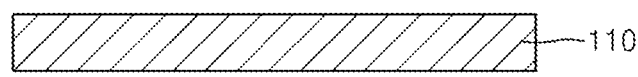
FIGS. 1 to 6 illustrate a method of forming a multilayer graphene structure according to example embodiments.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of inventive concepts to those of ordinary skill in the art. In the drawings, the thicknesses of layers and regions are exaggerated for clarity. Like reference numerals in the drawings denote like elements, and thus their description may be omitted.

It will also be understood that when a layer is referred to as being on another layer or substrate, it can be directly on the other layer or substrate, or intervening layers may also be present. In contrast, when an element is referred to as being "directly on", there are no intervening layers present. Other words used to describe the relationship between elements or layers should be interpreted in a like fashion (e.g., "between" versus "directly between," "adjacent" versus "directly adjacent," "connected" versus "directly connected"). As used herein the term "and/or" includes any and all combinations of one or more of the associated listed items.

In the following description, a material forming each layer is an example and thus other materials may be used therefor. As used herein, expressions such as "at least one of," when preceding a list of elements, modify the entire list of elements and do not modify the individual elements of the list.

It will be understood that, although the terms "first", "second", etc. may be used herein to describe various elements, components, regions, layers and/or sections. These elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIGS. 1 to 6 illustrate a method of forming a multilayer graphene structure 130 according to example embodiments. Referring to FIG. 1, a growth substrate 110 is prepared. The growth substrate 110 functions as a catalyst for growing graphene and may include a metal and/or metal alloy. For example, the growth substrate 110 may include at least one of Cu, Ni, Pt, Rh, Ir, and Ag. However, example embodiments are not limited thereto and the growth substrate 110 may include a variety of materials.

Figure 2:
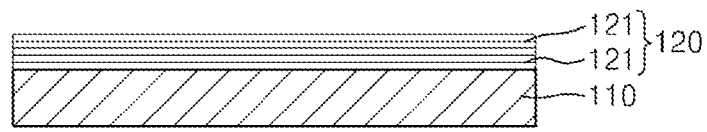

Referring to FIG. 2, a sacrificial layer 120 is formed on the growth substrate 110. The sacrificial layer 120 may be formed directly on the growth substrate 110. The sacrificial layer 120 may be removed by hydrogen atoms as described later, thereby forming a plurality of graphene layers 131 on the growth substrate 110. The sacrificial layer 120 may include hexagonal boron nitride (h-BN). For example, the sacrificial layer 120 may be formed of a plurality of h-BN films 121. The sacrificial layer 120 may include N sacrificial films 121 stacked on each other. N may be an integer greater than 1. Alternatively, the sacrificial layer 120 may be formed of only one h-BN film 121.

The sacrificial layer 120 may be formed by growing h-BN to a desired (and/or alternatively predetermined) thickness on the growth substrate 110 by the CVD method. For example, when the growth substrate 110 is formed of Cu, a growth temperature of h-BN may be about 950° C.~about 1075° C. However, example embodiments are not limited thereto and the growth temperature may be variously changed. A growth time of h-BN may be variously changed according to the thickness of the sacrificial layer 120 to be formed. For example, the growth time of h-BN may be about 20 minutes~about 60 minutes. In this case, the sacrificial layer 120 may be formed to a thickness of about 1 nm to tens of nanometers. The sacrificial layer 120 may be formed to a thickness of about 1 nm to about 10 nm, but is not limited thereto. In detail, when the growth time is about 20 minutes, the sacrificial layer 120 having one h-BN film 121 with a thickness of about 1 nm may be formed. When the growth time is about 60 minutes, the sacrificial layer 120 having tens of the h-BN films 121 with a thickness of tens of nanometers may be formed. In the following description, a case in which the sacrificial layer 120 is formed of a plurality of h-BN films 121 will be discussed.

Figure 3:
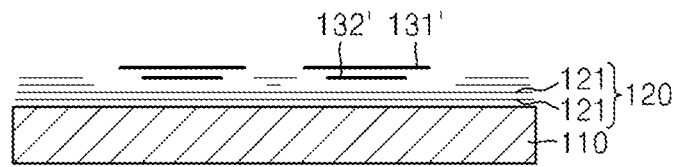

Referring to FIG. 3, a first graphene 131' is grown on the sacrificial layer 120 and a second graphene 132' is epitaxially grown on a lower surface of the first graphene 131'. The growth of the first and second graphenes 131' and 132' may be performed using a CVD method. The CVD method may be, for example, a low pressure chemical vapor deposition (LPCVD) method, an atmosphere pressure chemical vapor deposition (APCVD) method, or a plasma enhanced pressure chemical vapor deposition (PECVD) method, but example embodiments are not limited thereto. The growth temperature of the first and second graphenes 131' and 132' may be, for example, about 900° C.~about 1050° C. However, example embodiments are not limited thereto and the growth temperatures of the first and second graphenes 131' and 132' may be variously changed. According to example embodiments, at least one carbon supply source may be used in a CVD method for growing the first and second graphenes 131' and 132'. For example, the carbon supply source may be $CH_4$ gas; however, example embodiments are not limited thereto. For example, the carbon supply source may include other gases in addition to $CH_4$ gas and/or besides $CH_4$ gas, such as acetylene ($CH_2H_2$) gas, ethylene ($C_2H_4$) gas, ethenone ($H_2C_2O$) gas, and benzene ($C_6H_6$) gas; however, example embodiments are not limited thereto. The flow rate for the carbon supply source (e.g., $CH_4$ gas) may range from about 0.1 to about 10 sccm, but is not limited thereto. The growth time may range from about 30 minutes to 24 hours, but is not limited thereto.

In detail, when a CVD process starts, the first graphene 131' starts to grow on an upper surface of the sacrificial layer 120 that is formed of the h-BN films 121. While the first graphene 131' grows, the h-BN films 121 provided under the first graphene 131', for example, the uppermost one of the h-BN films 121 provided under the first graphene 131', are partially removed. In other words, as the CVD process continues, a $CH_4$ molecule that is a carbon supply source is separated into hydrogen atoms and a carbon atom and the generated hydrogen atoms cut off and remove the h-BN films 121 disposed under the first graphene 131' that grows. Accordingly, space is formed under the first graphene 131' that grows, due to the removal of the h-BN films 121. Thus, the second graphene 132' may epitaxially grow on the lower surface of the first graphene 131'.

Figure 4:
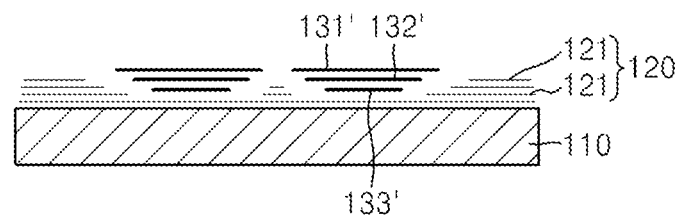

Referring to FIG. 4, the first and second graphenes 131' and 132' continues growing and a third graphene 133' epitaxially grows on a lower surface of the second graphene 132'. As described above, the growth temperature of the third graphene 133' may be, for example, about 900° C.~about 1050° C., but example embodiments are not limited thereto. In detail, while the first and second graphenes 131' and 132' grow, the h-BN films 121 provided under the second graphene 132', for example, the uppermost one of the h-BN films 121 provided under the second graphene 132', are partially removed. In other words, as the CVD process continues, the hydrogen atoms that are generated by the decomposition of the $CH_4$ molecules cut off and remove the h-BN films 121 disposed under the second graphene 132' that grows. Accordingly, space is formed under the second graphene 132' that grows, due to the removal of the h-BN films 121. Thus, the third graphene 133' may epitaxially grow on the lower surface of the second graphene 132'.

Figure 5:
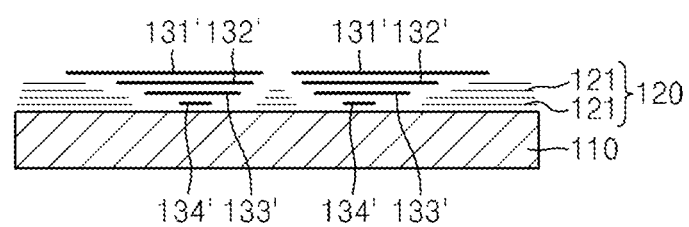

Referring to FIG. 5, the first, second, and third graphenes 131', 132', and 133' continues growing and a fourth graphene 134' epitaxially grows on a lower surface of the third graphene 133'. As described above, the growth temperature of the fourth graphene 134' may be, for example, about 900° C.~about 1050° C., but example embodiments are not limited thereto. In detail, while the first, second, and third graphenes 131', 132', and 133' grow, the h-BN films 121 provided under the third graphene 133', for example, the h-BN films 121 provided between the third graphene 133' and the growth substrate 110, are partially removed. In other words, as the CVD process continues, the hydrogen atoms that are generated by the decomposition of the $CH_4$ molecules cut off and remove the h-BN films 121 disposed between the growth substrate 110 and the third graphene 133' that grows. Accordingly, space is formed between the growth substrate 110 and the third graphene 133' that grows, due to the removal of the h-BN films 121. Thus, the fourth graphene 134' may epitaxially grow on the lower surface of the third graphene 133'.

Figure 6:
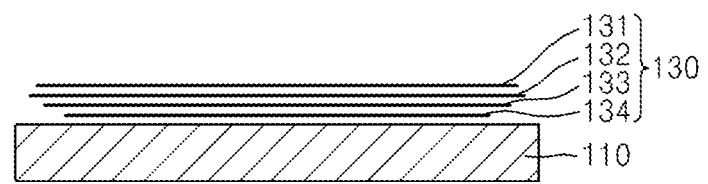

Referring to FIG. 6, when the growth of the first, second, third, and fourth graphenes 131', 132', 133', 134' is completed, first, second, third, and fourth graphene layers 131, 132, 133, 134 that are epitaxially grown are sequentially formed on and above the growth substrate 110. As a result, the multilayer graphene structure 130 including the first, second, third, and fourth graphene layers 131, 132, 133, 134 that are epitaxially grown is completed. Alternatively, the sacrificial layer 120 may be entirely removed or a part of the sacrificial layer 120 may be left on the growth substrate 110 or in the multilayer graphene structure 130.

Although the multilayer graphene structure 130 including four (4) graphene layers 131, 132, 133, and 134 is described as an example in the above description, example embodiments are not limited thereto and the multilayer graphene structure 130 may include a variety of numbers of graphene layers. The growth time of the graphene layers may be determined according to the thickness of a sacrificial layer and the number of graphene layers. For example, the growth time of the graphene layers may be about 30 minutes~about 24 hours, but example embodiments are not limited thereto. The number of graphene layers forming the multilayer graphene structure 130 may be determined according to the thickness of the sacrificial layer formed of h-BN. For example, the number of graphene layers may correspond to the number of h-BN films forming the sacrificial layer. Alternatively, the number of graphene layers may not correspond to the number of the h-BN films forming the sacrificial layer.

Figure 7A:
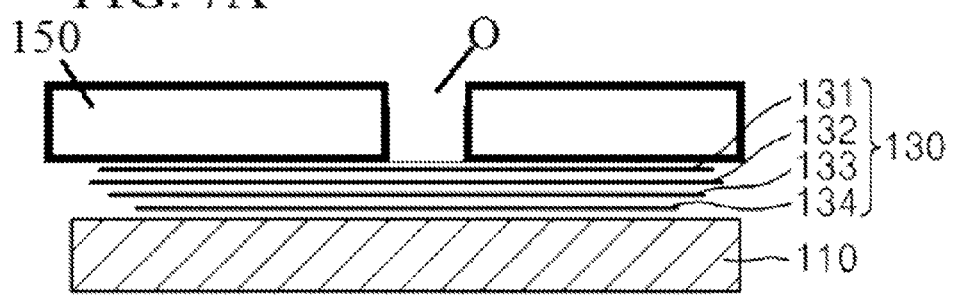
FIGS. 7A to 7B illustrate a method of forming a plurality of multilayer graphene structures on a substrate according to example embodiments.
Figure 7B:
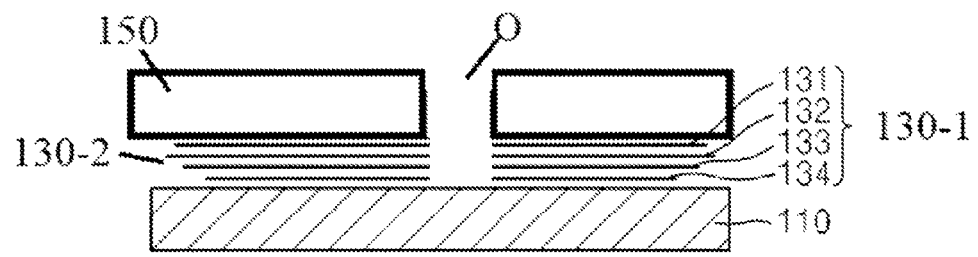

FIGS. 7A to 7B illustrate a method of forming a plurality of multilayer graphene structures on a substrate according to example embodiments.

Referring to FIG. 7A, a masking pattern 150 may be formed on the multilayer graphene structure 130 in FIG. 6 of the present application. The masking pattern 150 may define at least one opening O that exposes the multilayer graphene structure 130.

Referring to FIG. 7B, an oxygen plasma process may be used to remove the portion of the multilayer graphene structure 130 exposed by the masking pattern 150. As a result, the multilayer graphene structure 130 may be separated into a plurality of multilayer graphene structures 130-1 and 130-2. The masking pattern 150 may then be removed using at least one etchant that selectively removes the masking pattern 150 without removing the graphene structures 130-1 and 130-2.

As illustrated in FIG. 7B, the multilayer graphene structures 130-1 and 130-2 have a same number of graphene layers.

FIGS. 8A to 8H illustrate a method of forming a plurality of multilayer graphene structures according to example embodiments.

Figure 8A:
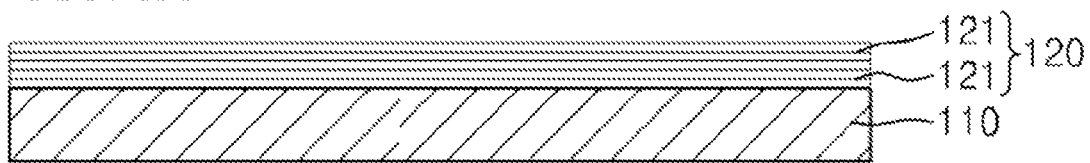
FIGS. 8A to 8H illustrate a method of forming a plurality of multilayer graphene structures according to example embodiments.

Referring to FIG. 8A, a sacrificial layer 120 including a plurality of sacrificial films 121 may be formed on the growth substrate 110, similar to FIG. 2 of the present application.

Figure 8B:
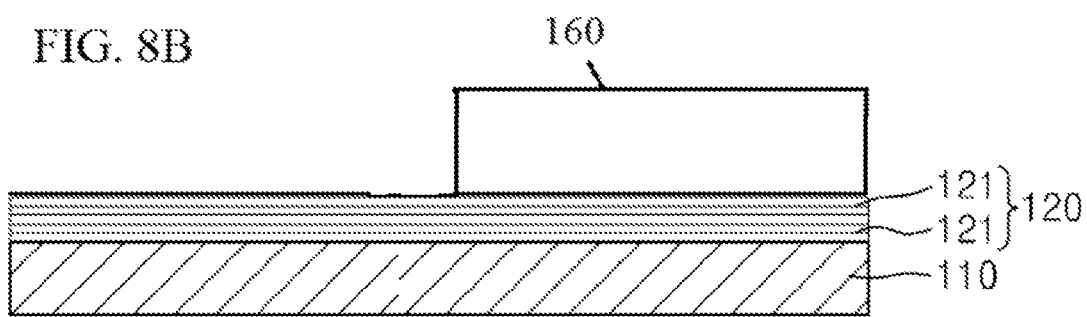

Referring to FIG. 8B, a masking pattern 160 may be formed on the sacrificial films 121. The masking pattern 160 may expose a portion of the sacrificial films 121.

Figure 8C:
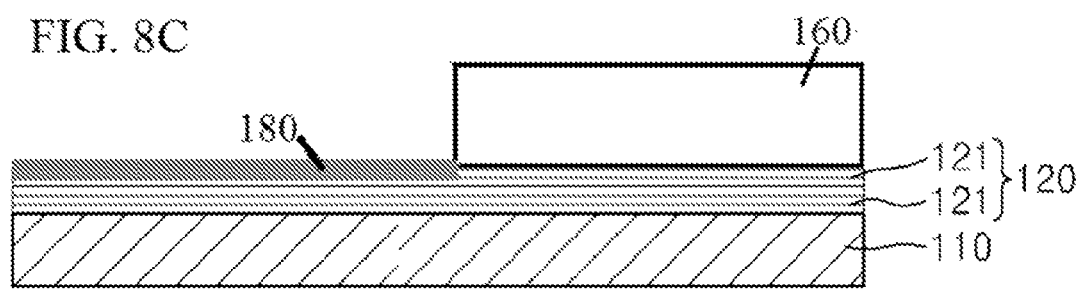

Referring to FIG. 8C, the CVD method discussed above may be used to form a graphene layer 180 on the masking pattern 160. Forming the graphene layer 180 may remove a portion of an upper most one of the sacrificial films 121 that is exposed by the masking pattern 160.

Figure 8D:
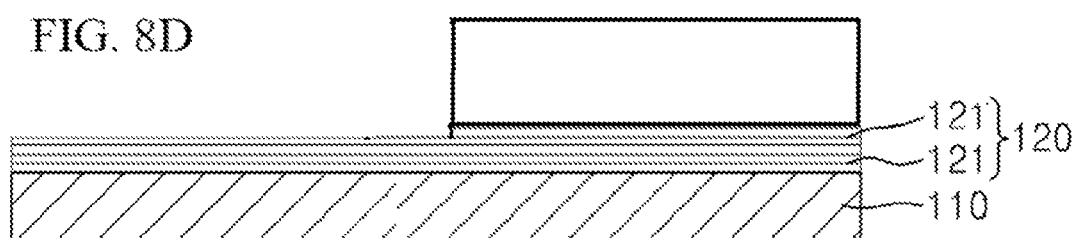

Referring to FIG. 8D, an oxygen plasma process may be used to remove the graphene layer 180.

Figure 8E:
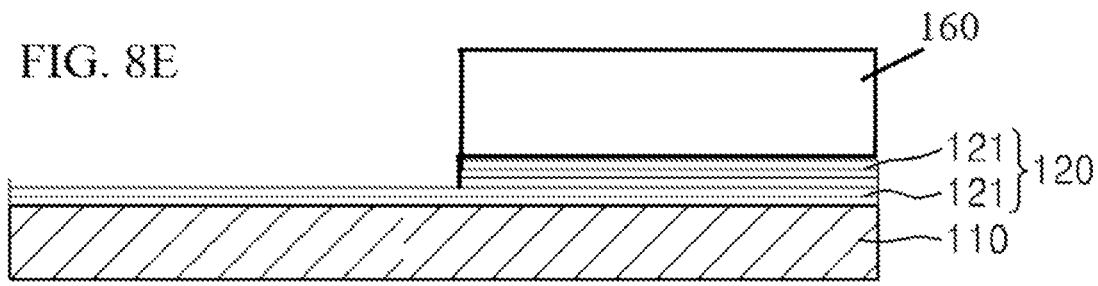

Referring to FIG. 8E, the steps illustrated in FIGS. 8C and 8D may be repeated to remove a portion of at least one other sacrificial film 121.

Figure 8F:
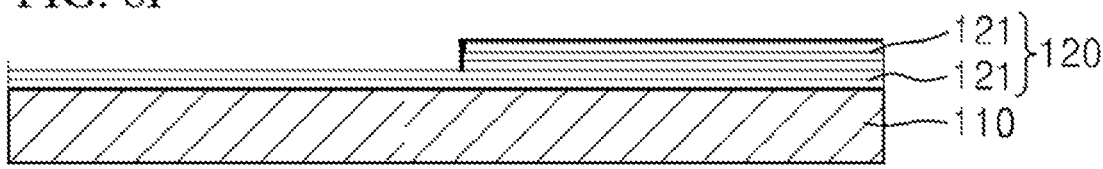

Referring to FIG. 8F, the masking pattern 160 may be removed.

Figure 8G:
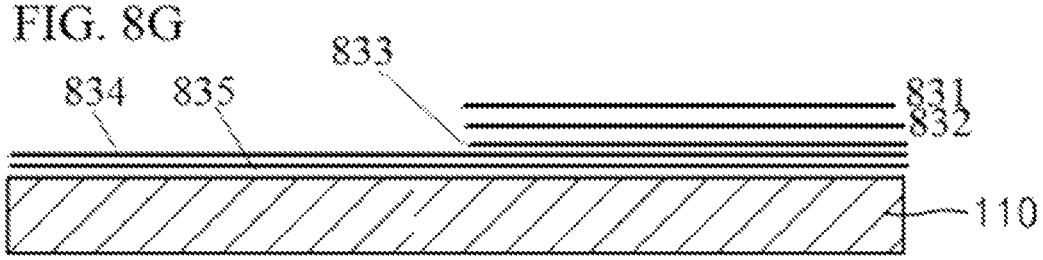

Referring FIG. 8G, the CVD method to grow graphene layers 131 to 134 (discussed above with reference to FIGS. 3-6 of the present application) may be repeated to form graphene layers 831 to 835. However, because exposed portions of the upper two sacrificial films 121 were removed in FIGS. 8C to 8E, fewer graphene layers will form in that area.

Figure 8H:
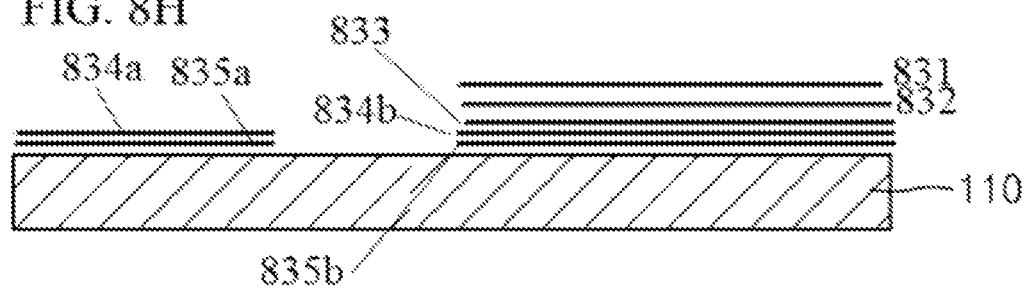

Referring to FIG. 8H, similar to FIG. 7B discussed above, a masking pattern and oxygen plasma process may be used to remove a portion of the graphene layer 834-835 to form two separate multilayer graphene structures. One of the multilayer graphene structures may include graphene layers 834a and 835a. The other multilayer graphene structure may include graphene layers 831-833, 834b, and 835b.

Although FIGS. 8A to 8H illustrate a non-limiting example where the steps in FIGS. 8C and 8D are repeated twice, one of ordinary skill in the art would appreciate that example embodiments are not limited thereto. The steps in FIGS. 8C and 8D may be repeated more than twice or fewer than twice, depending on the number of sacrificial film 121 portions that are desired to be removed. The number of sacrificial film 121 portions removed may depend on the number of graphene layers that are desired to be formed.

As described above, according to example embodiments, a multilayer graphene structure having three or more graphene layers may be manufactured with high quality and in a large size. Also, the multilayer graphene structure that is formed of graphene layers that are epitaxially grown exhibits physical properties, for example, a bandgap, different from a graphene structure with one graphene layer and may be applied to a variety of device fields.

Example embodiments described herein should be considered in a descriptive sense only and not for purposes of limitation. While some example embodiments have been particularly shown and described, it will be understood by one of ordinary skill in the art that variations in form and detail may be made therein without departing from the spirit and scope of the claims.

What is claimed is:

1. A method of forming a multilayer graphene structure, the method comprising:
    forming a sacrificial layer including a plurality of hexagonal boron nitride (h-BN) films on a growth substrate;
    growing a first epitaxial graphene layer on the sacrificial layer using a chemical vapor deposition (CVD) method, the growing the first epitaxial graphene layer including removing an uppermost part of the h-BN films to leave remaining h-BN films;
    forming a second epitaxial graphene layer on an upper surface of the remaining h-BN films using the CVD method, and removing an uppermost part of the remaining h-BN films under the first graphene layer during the forming the second graphene layer using the CVD method; and
    forming a third epitaxial graphene layer by epitaxially growing the third epitaxial graphene layer on the remaining h-BN films, wherein a lower surface of the second epitaxial graphene layer is on the third epitaxial graphene layer.

2. The method of claim 1, wherein the growth substrate includes at least one of Cu, Ni, Pt, Rh, Ir, and Ag.

3. The method of claim 1, wherein the forming the sacrificial layer includes growing the h-BN films using a CVD process.

4. The method of claim 3, wherein a growth temperature of the h-BN films in the CVD process is about 950° C. to about 1075° C.

5. The method of claim 3, wherein a growth time of the h-BN films in the CVD process is about 20 minutes to about 60 minutes.

6. The method of claim 3, wherein a thickness of the sacrificial layer is about 1 nm to about tens of nm.

7. The method of claim 1, wherein the CVD method includes one of a low pressure chemical vapor deposition (LPCVD) method, an atmosphere pressure chemical vapor deposition (APCVD) method, and a plasma enhanced pressure chemical vapor deposition (PECVD) method.

8. The method of claim 1, wherein growth temperatures during the forming the first and second epitaxial graphene layers are about 900° C. to about 1050° C.

9. The method of claim 1, wherein the CVD method includes $CH_4$ as a process gas.

10. The method of claim 1, wherein the CVD method used for forming the second expitaxial graphene layer includes: generating hydrogen atoms by decomposing the $CH_4$, and removing the uppermost part of the h-BN films from under the first epitaxial graphene layer using the hydrogen atoms generated as the $CH_4$ is decomposed.

11. The method of claim 1, further comprising: removing an uppermost part of the remaining h-BN films during the forming the third epitaxial graphene layer; and forming a fourth epitaxial graphene layer by epitaxially growing the fourth epitaxial graphene layer on the remaining h-BN films, wherein a lower surface of the third epitaxial graphene layer is on the fourth epitaxial graphene layer.

12. A method of forming a multilayer graphene structure, the method comprising:
    forming N sacrificial films on a growth substrate, the N sacrificial films stacked on each other, N being an integer greater than 1;
    forming M graphene layers on the growth substrate using a chemical vapor deposition (CVD) method, M being an integer greater than 1 and less than or equal to N,
    the M graphene layers including a (M-1)th graphene layer,
    the forming M graphene layers including removing at least an uppermost part of the N sacrificial films under the (M-1)th graphene layer while forming the Mth graphene layer during the CVD method and a number of the graphene layers formed during the forming M graphene layers is controlled based on a quantity of the sacrificial films formed during the forming N sacrificial films.

13. The method of claim 12, wherein the growth substrate includes a catalyst for forming the M graphene layers using the CVD method, and the N sacrificial films are hexagonal boron nitride (h-BN) films.

14. The method of claim 12, wherein the forming N sacrificial films includes forming N sacrificial films directly on the growth substrate.

15. The method of claim 14, wherein M is greater than or equal to 3.

16. The method of claim 14, wherein the CVD method includes at least one of: using $CH_4$ as a process gas, and a process temperature of about 900° C. to about 1050° C.

* * * * *